United States Patent [19]

Vancsa

[11] 4,349,821
[45] Sep. 14, 1982

[54] DATA ACQUISITION SYSTEM AND ANALOG TO DIGITAL CONVERTER THEREFOR

[75] Inventor: Gyorgy I. Vancsa, Pittsburgh, Pa.

[73] Assignee: Westinghouse Electric Corp., Pittsburgh, Pa.

[21] Appl. No.: 116,053

[22] Filed: Jan. 28, 1980

[51] Int. Cl.³ ............................................. H04Q 5/00
[52] U.S. Cl. ............................ 340/870.21; 340/870.31
[58] Field of Search ........... 340/347 M, 347 AD, 183, 340/147 R, 870.19–870.21, 870.31

[56] References Cited

U.S. PATENT DOCUMENTS 3,833,903 9/1974 Gordon et al. ............... 332/16 R X

OTHER PUBLICATIONS

The Engineering Staff of Analog Devices, Inc., Analog-Digital Conversion Handbook, 6/72, pp. I-26 to I-33.

Primary Examiner—Thomas J. Sloyan
Attorney, Agent, or Firm—C. M. Lorin

[57] ABSTRACT

From a plurality of parallel channels of communication, each including a voltage-to-frequency (V/F) converter, a central clock synchronously timed for each channel, the derivation of a train of pulses having a number of pulses representative of the magnitude of an analog signal inputted to the V/F converter. The central clock also times the multiplexing at the measuring point of either the analog input signal or a bias voltage for calibration or a voltage reference for scaling. The central processor receives the counts from each train of pulses, combines them and threats them to provide a corrected count in each channel separately. Clocking and pulsing are effected through an isolation transformer associated with each channel, to and from the central processor.

5 Claims, 5 Drawing Figures

DATA ACQUISITION SYSTEM AND ANALOG TO DIGITAL CONVERTER THEREFOR

BACKGROUND OF THE INVENTION

The invention relates to data acquisition systems in which a plurality of remote analog inputs are monitored and controlled from a central location and in digital form by a computer.

It is known from U.S. Pat. No. 3,530,458 of F. G. Willard et al. to use a centrally located oscillator and counter for deriving a count in relation to multiplexed analog inputs for the purpose of point measurement, noise reduction, digital gain and zero calibration under control of a computer.

It is known from U.S. Pat. No. 4,068,306 of A. C. Chen et al. to control with a computer the application of local reference signals for calibration purpose and of an analog input to a local integrator for deriving a count to be utilized by the computer with other counts derived by multiplexing from a plurality of possible single point measurement locations.

It is also known from U.S. Pat. No. 3,916,173 of R. B. Williams et al. to make scale and zero corrections with a computer in relation to a plurality of analog input signal measurement channels for passive zeroing.

The three above-identified patent references indicate that digital treatment with a computer is advantageous for monitoring and control of a plurality of single point analog input measurement channels, in particular for offset correction and calibration as well as measurement. Nevertheless, the prior art has not been able to use this central computer approach to the maximum advantage.

SUMMARY OF THE INVENTION

An object of the present invention is to centralize the timing and control functions with the computer of a computerized multiplexed data acquisition system in such a way that precision requirements for the local hardware components can be lessened substantially. Thus, maximization of quality measurement behind the measurement channels will allow less stringent requirements in the manufacture of the circuit and components at the channel locations. This makes it possible to use less costly equipment at the many measuring stations without experiencing any lowering of the measurement standards.

The object of the invention is achieved by combining several features as follows.

A plurality of measuring channels are related to a central timer by individual isolation transformers. The central timer is used to provide a control signal for each of a plurality of DC/AC converters pertaining each to one channel the control signal being operative on the conversion cycle through the corresponding isolation transformer. AC current is supplied from the primary to the secondary side, which is rectified to form a DC power supply for the measuring unit of the particular channel. For the conversion of the analog input data at the measuring point, a converter of the charge-balancing voltage to frequency (V/F) type is used which is synchronized by the central timer. This is important in the context of the present invention because at the secondary side of the isolation transformer, the conversion cycle can be timed with precision from the central timer, and this is done centrally and in parallel for all channels. Flip-flop CMOS devices are used in translating the logic of the V/F converter conversion cycle. These solid state devices are clocked by the AC voltage upon each half-cycle. Transmission of the logical data as a pulse is achieved by loading the secondary of the isolation transformer with a discharge capacitor. Such abrupt transition causes a surge of current at the primary side which is detected and amplified by a transistor, thus generating a pulse which identifies the count of the V/F converter in exact timing with the cycle, thus, the central clock. Such loading at the secondary side of the isolation transformer does not interfere with the AC current power supply from the primary side of the transformer.

Another important feature of the present invention resides in having at least three possible analog data input at the measuring end of the measuring unit of the channel. One analog input data is a stable bias voltage allowing positive and negative values to be measured while providing a known measured value. A second analog input data is another stable voltage to be used with the bias voltage as a second known measured value. The third analog input data is the signal at the measuring point. A multiplexer in the form of CMOS devices is associated with a three-stage ring counter for the selection of these three analog input data in time succession. The clock signal from the central unit is used through the isolation transformer for causing the multiplexer to pass into a subsequent stage. Such clocking action is effected by interrupting the AC current power supply from the primary side, thus, by merely interrupting the clocking of the DC/AC power converter, e.g. of a power switch associated thereto. Thus, interruption is translated, after the rectifying stage of the DC power supply at the secondary side of the isolation transformer, into a logical transition equivalent to a clock pulse applied to the multiplexer.

Accordingly, for each such multiplexer stage, the data acquisition system according to the invention transmits through the isolation transformer of the selected channel a series of pulses which are received and stored in an associated counter. These counts are then treated as digital data by the central computer for offset correction, calibration, scaling, and measurement data processing.

Preferably, all the channels with the associated transformers, and DC power supply units are mounted on a common board with the central timer and digital data processing unit in the form of a microcomputer. Such a collective board has all the advantageous features of the invention. It is compact and light. It includes low cost hardware components in the various channels. The precision and sophistication requirements are centered around the central timer and the microcomputer. Such data acquisition system can be easily plugged as a subsystem into the overall control and computerized system of a general process control having so many measuring points as there are channels and generating correlated command signals controlling the process.

BRIEF DESCRIPTION OF THE DRAWINGS

FIG. 2 shows with curves the conversion cycles of the A/D converter of FIG. 1;

FIG. 4 illustrates with curves the operation of the flip-flop of FIG. 3;

FIG. 5 shows two linear transfer functions used by the microcomputer of the data acquisition system of FIG. 1 in recurrently computing correct digital data representing inputted analog data after calibration and scaling in each of the parallel measurement channels.

DETAILED DESCRIPTION OF THE DATA ACQUISITION SYSTEM ACCORDING TO THE INVENTION

Figure 1:
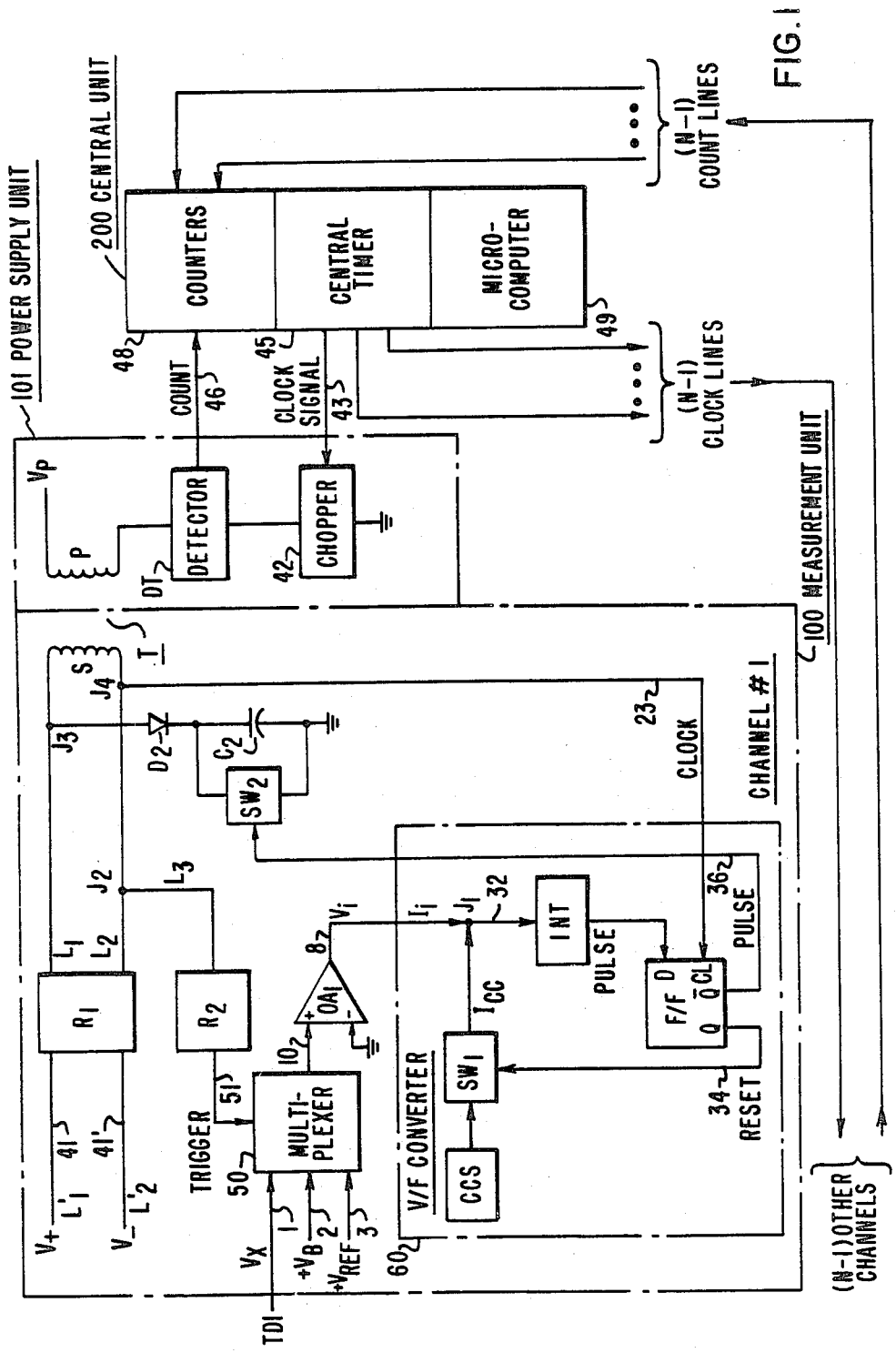
FIG. 1 is a schematic view of the analog-to-digital converter according to the present invention, inserted in one of a plurality of parallel measurement channels in a data acquisition system, also according to the present invention.

Referring to FIG. 1, a central unit 200 containing a microcomputer 49, a plurality of counters 48 and a central timer 45 is shown monitoring and controlling in parallel N measurement channels. Each measurement channel possesses, as shown for channel #1, a measurement unit 100 and a power supply unit 101 coupled by an isolation transformer T. A direct current voltage source ($V_p$) is applied to a chopper (or DC/AC converter) 42 under control of a clock signal received on line 43 from the timer 45 of the central unit 200. As a result, the primary P of transformer T is excited by AC current at the frequency of the clock signal. The secondary S of transformer T in measurement unit 100 is rectified by rectifier $R_1$ so as to establish on lines 41, 41' respective DC voltages $V+$ and $V-$. In measurement unit 100 a multiplexer 50 is responsive via input line 1 to the analog input signal $V_X$ derived at a measuring point from a transducer $TD_1$, which may be a thermocouple, or other analog variable sensing device. On line 2 a bias voltage $V_B$ is applied, and on line 3 is applied a reference voltage $V_{REF}$ which is supplied by a stable voltage source SVS. Multiplexer 50 is controlled from line 51, as explained hereinafter, so as to step sequentially in a ring-counter fashion into the three successive states defined by lines 1, 2 and 3. As a result, at the output 10, a voltage is derived representing one of the three possible voltages $V_X, V_B$ and $V_{REF}$ depending on the operative step of multiplexer 50. The voltage of line 10 is inputted into the non-inverting input of an operational amplifier $OA_1$ having the inverting input at ground. The output on line 8 is a preamplified signal $V_i$. Signal $V_i$ is inputted (via a resistor $R_i$ shown in FIG. 3) into a voltage-to-frequency (V/F) converter 60 (shown with more details in FIG. 3). Converter 60 outputs on line 36 a series of pulses which are counted by the central unit 200 during a predetermined measurement time interval T, thus providing a count characteristic of the magnitude of analog signal $V_i$.

V/F converter 60 (shown also in FIG. 3) consists in a charge-balancing circuit including a constant current source CCS a switch $SW_1$ for inserting source CCS in circuit, an integrator INT responsive from node $J_1$ and line 32 to current signal $I_i$, and constant current $I_{CC}$ from current source CCS and switch $SW_1$ when the latter is closed. Integrator INT ramps down through a threshold while charging under signal $I_i$ and ramps back in the amount of current $I_{CC}+I_i$, when via a flip-flop FF, $SW_1$ is closed. Ramping is up to a level determined by the clock signal by which, via flip-flop FF, switch $SW_1$ is again opened. The cycle repeats itself, first by ramping down.

The operation of V/F converter 60 is best understood from the interaction of flip-flop FF, integrator INT and switch $SW_1$, in the light of the curves of FIG. 2. Referring to FIG. 2, curves (a) through (f) represent respectively:

(1) ramping action of the integrator INT in response to voltage $V_i$ when switch $SW_1$ is open (linear portions OA, BC, DE, FG of curve (a) and, in response to $I_{CC}+I_i$, when switch $SW_1$ is closed (linear portions AB, CD, EF, GH of curve (a));

(2) curve (b) is the interrupt signal which controls multiplexer 50;

(3) curve (c) indicates that after a delay the multiplexer is reset;

(4) curve (d) is the clock signal applied via line 23 to the clock pin of flip-flop FF;

(5) counting for all counters 48 in parallel is enabled during a fixed time interval (T) defined by curve (e);

(6) curve (f) indicates the count derived in relation to a train of pulses derived on line 36 from the Q pin of flip-flop FF. These pulses correspond to the lower peaks A, C and E of curve (a).

In accordance with the charge-balancing technique of a voltage to frequency converter, a capacitor $C_1$ within integrator INT is progressively charged under the effect of the applied signal $I_i$. The integrator ramps with a slope which is a function of $V_i$ until the threshold is passed. However, this fact is acknowledged by the circuit only when a clock signal is received (curve (d)). When this occurs (at A on curve (a)) by line 23 the clock causes the data to appear at the Q and $\overline{Q}$ pins of the flip-flop. As a result, on line 36 the $\overline{Q}$ state appears as one of the pulses of curve (d) and by line 34 the Q pin causes the switch $SW_1$ to be set, e.g. $I_{CC}$ to be applied at node $J_1$ and on line 32. Therefore, the integrator ramps up from A with a slope defined by $I_i+I_{CC}$ but dominated by $I_{CC}$. The operative point passes again the threshold. When the next clock signal occurs on line 23 switch $SW_1$ is turned OFF. The ramp turns around at B and another cycle is initiated. In the example shown by FIG. 2, e.g. for the duration of the time interval (T) three pulses derived on line 36 from flip-flop FF have been registered into counter 48. This count of three is in proportion to the magnitude of the voltage $V_i$ applied during time interval (T). In the first stage of multiplexer 50, an analog input signal of magnitude $V_X$ is applied, the number of pulses is characteristic of such magnitude $V_X$. When the analog input signal vary, during successive measurement time intervals (T) the V/F converter will provide on line 36 a correlative variable number of pulses. It will be explained hereinafter by reference to FIG. 3 how the trigger signal of line 51 to the multiplexer 50 and the clock signal 23 to flip-flop FF are generated and synchronized by the central timer 45 outputting a clock signal on line 43. It will be also explained in relation to FIG. 3 how a pulse train outputted on line 36 by the flip-flop FF is transmitted through isolation transformer T and applied on line 46 to derive a count by one of the enabled counters 48 of the central unit 200. For the sake of clarity, FIG. 1 shows in simplified form the preceding functions embodied in a block diagram as follows.

The clock signal on line 43 from the central timer 45 controls chopper 42 to generate AC current at the primary P of transformer T. Between lines $L_1$ and $L_2$ at the extremities of secondary S, a rectifier $R_1$ converts AC power into DC power appearing as potentials $V_+$ and $V_-$, on lines $L'_1$ and $L'_2$, for the measurement unit 100. Typically, $V_+$ and $V_-$ are +12 volts and −12 volts, respectively. The AC line $L_2$ at node $J_2$ is connected by line $L_3$ onto a second rectifier $R_2$ so as to provide on line 51 a rectified output normally applied to the controlling gate of multiplexer 50. In order to trigger multiplexer 50 from the central unit into a subsequent state, microcomputer 49 causes the clock signal to exhibit an interruption (not shown). When this occurs, chopper 42 no longer being controlled, the rectified voltage of line 51 collapses. It is assumed, however, that the time constant of circuit $R_1$ as opposed to the time constant of circuit $R_2$ is sufficiently larger that no effect will have the time to appear on lines $L'_1$, $L'_2$ which otherwise would disable the entire power supply of the measurement unit 100. Under this assumption, the short interruption of the clock signal of line 43 will cause an abrupt transition on line 51 which is used by multiplexer 50 for stepping to a subsequent stage. In this fashion, by successive and time selected interruptions of the clock signal of line 43, the microcomputer can step the multiplexer in a ring-counter fashion through its successive stages, namely to translate on line 10 voltages $V_X$, $V_B$ and $V_{REF}$.

With regard to clocking of the flip-flop FF, at node $J_3$ on line $L_1$ at the secondary S of the transformer is derived a signal which is synchronous with the AC current induced from the primary, then with the control signal of the chopper on line 43. Therefore, flip-flop FF is in fact set and reset synchronously via line 23 by the clock signal of line 43 from the centraltimer 45.

Figure 3:
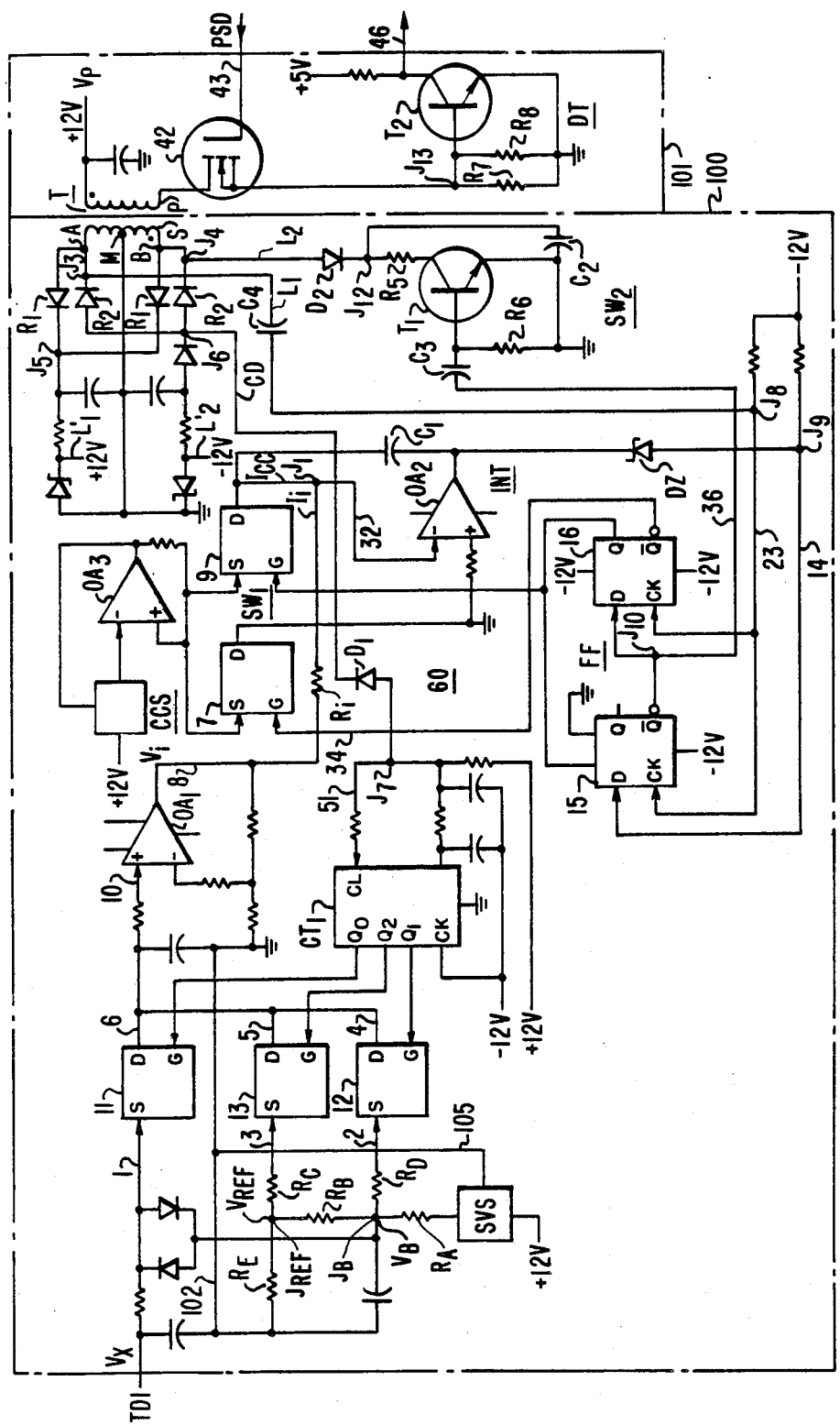
FIG. 3 is specific circuitry for the A/D converter of FIG. 1, in the preferred embodiment of the invention.

Considering the pulse train outputted on line 36 by flip-flop FF, line 36 is applied to the gate of a switch $SW_2$ mounted in parallel to a capacitor $C_2$. Capacitor $C_2$ is in series with a diode $D_2$, thus forming a series network between node $J_4$ on line $L_2$ of the secondary S and ground. When switch $SW_2$ is open, capacitor $C_2$ is charged from the secondary S via diode $D_2$. When switch $SW_2$ is closed, capacitor $C_2$ is quickly discharged. Therefore, each time a pulse on line 36 causes switch $SW_2$ to close, which occurs with the clock signal upon one alternance of the clock, upon the next alternance charging of capacitor $C_2$ via diode $D_2$ will abruptly load the secondary S of isolation transformer T. As a result, a surge of current will appear at the primary. A detector DT coupled with the primary P (which is shown in FIG. 3, as opposed to FIG. 1, placed behind chopper 42 rather than before) will translate the surge into a pulse applied as a count on line 46 to the corresponding counter 48.

It appears from the above description of the structural and functional features of channel #1 given in relation to central unit 200, that when multiplexer 50 is in a given stage, for instance stage #1, e.g. when $V_X$ via line 1 appears as $V_i$ on line 8, integrator INT will cause on line 33 so many pulses to be counted in relation to the magnitude of $V_X$ during the measurement time interval from V/F converter 60. When generating such a pulse, flip-flop FF will cause by line 36 and switch $SW_2$ via transformer T, the occurrence of so many surges of current at the primary side. These are detected by detector circuit DT and the outputted pulses of line 46 are totalized during the measurement time interval T by the associatedcounter 48, thus providing a count $C_X$. Similarly, when the multiplexer is in its second stage, namely with a voltage $V_B$ applied via line 2 and appearing as $V_i$ on line 8, a count $C_B$ will be totalized by the same associated counter 48. This count $C_B$ is indicative of the known voltage $V_B$. The same is done with the known voltage $V_{REF}$ while deriving a count $C_{REF}$. When autozeroing is practiced for the calibration of an A/D converter, the general practice is to set the analog input at zero volts for the duration of the testing step. Ddue to the errors inherent in the circuit, an offset value is derived as a count which must be taken as an offset of any measuring count derived with the actual analog input signal. Since it is desirable to be able to measure a negative as well as a positived input signal, it is good practice to use a bias voltage. The circuit of FIG. 1, as explained hereinafter by reference to FIG. 3 provides, a positive bias $V_B$ on line 2 applied to the operational amplifier $OA_1$. Therefore, when the multiplexer is in its first stage or measuring stage of line 1, operational amplifier $OA_1$ actually sees $V_X + V_B$. When multiplexer 50 is triggered to its third stage, namely to translate $V_{REF}$ from line 3 to line 10, and a count $C_{REF}$ is derived, because $V_{REF}$ is provided by a stable voltage source (SVS), the count $C_{REF}$ a reliable value to be used repeatedly like count $C_B$ upon each testing cycle.

Thus, after testing with the multiplexer 50 in its second and third stages, the voltages $V_B$ and $V_R$ translated as $V_i$ on line 8, have caused counts $C_B$ and $C_{REF}$ to be received successively through isolation transformer T at one of the counters 48. These constants $C_B$ and $C_{REF}$ are used to directly calibrate and relate in scale any measurement of $V_X$ providing a count $C_X$ which is adjusted to what it should be in absolute value.

More generally, each pulse of line 36 is transmitted through the isolation transformer T and received by one of the counters 48 when enabled to accumulate a count representative of the voltage $V_i$. It is understood that the voltage-to-frequency converter 60 of block 100 constitutes together with the associated counter 48 of the central unit 200 an analog-to-digital (A/D) converter. N such A/D converters are provided in parallel in relation to the respective N channels, and the various counters 48 of the central unit are accumulating in parallel respective counts representative of the measured, or tested signal $V_i$ on line 8 of the respective channels. All counters are reset and enabled by gate control from the microcomputer at the beginning of a conversion cycle. When enabled, the counters are counting data $V_i$ for the various channels in parallel. At the end of the measurement period T, the gates of the counters are closed in order that the microcomputer be able to retrieve, store and combine the various counts as required. As earlier state, $V_i$ may be either representative of $V_X$ when the multiplexer is in state #1, or of $V_B$ when the multiplexer is in state #2, or of $V_{REF}$ in the third state. While a count characteristic of $V_X$ may be derived by the A/D converter recurrently so as to monitor the variable $V_X$ of the industrial process to which the particular channel is associated, offset correction and scaling are from time to time effected in order to ascertain and eliminate possible errors due to temperature, drift . . . caused by the circuit of the particular channel. During such testing operation counts $C_B$ and $C_{REF}$ are obtained with the associated counter 48, namely at stage #2 and at stage #3 of the multiplexer 50. These results are stored in the RAM memory of the microcomputer and kept there until refreshed by a subsequent testing operation requested by the microcomputer as programmed. These counts $C_B$ and $C_{REF}$ are used for ascertaining the correct value $C_C$ of the count corresponding to the count $C_X$ derived by counter 48 in relation to $V_X$.

Referring to FIG. 3, the A/D converter according to the invention is shown in its preferred form. The multiplexer 50 appears to include a decade counter/divider CMOS solid state device $CT_1$ used as a state selector and a ring-counter, namely a CMOS Johnson Counter including three J-FET devices 11, 12, 13 for three successive states. Solid state device 11 is responsive to the input signal received on line 1 from the transducer, thermocouple, or other measuring device at the point of measurement. To solid state device 13 is applied, via line 3, the reference voltage $V_{REF}$ derived from a stable voltage source SVS (2.5 volts). The bias voltage $V_B$ is applied via line 2 to the S input of solid state device 12.

The stable voltage source SVS is applied via a resistor $R_A$ to a node $J_B$ which is common to the common mode of the channel inputs, to one end of an input resistor $R_D$ of line 2 leading to the S input of device 12, and to one end of a resistor $R_B$. Thus, stable voltage source SVS applies a known voltage at node $J_B$ (which the bias $V_B$) and another known voltage at the other end of resistor $R_B$, which is a node $J_{REF}$ common to a resistor $R_E$ connected to ground via lead 102, and to a resistor $R_C$ connected by line 3 to the S input of device 13. Thus, at node $J_{REF}$, voltage source SVS establishes a known voltage $V_{REF}$. The negative potential of voltage source SVS is connected to ground via leads 105 and 102. Typically, the stable voltage source SVS is at +2.5 volts, and voltages $V_B$ and $V_{REF}$ are of the order of several millivolts.

When measuring $V_B$, switch 12 is closed and a positive potential bias $V_B$ is applied by lines 2 and 4 to the non-inverting input of operational amplifier $OA_1$. When the unknown input signal $V_X$ is to be measured, switch 11 is closed so that preamplifier $OA_1$, actually sees between inverting and non-inverting input $V_X + V_B$. In the third state of multiplexer 50, voltage $V_{REF}$ of line 3 is fed via closed switch 13 and line 5 onto operational amplifier $OA_1$. These three states lead as earlier stated to separate counts $C_B$, $C_X$ and $C_{REF}$ at the output of the A/D converter, namely with the associated counter 48 of the central unit, which stores the counts and treat them digitally in the microcomputer 49. Control of the selector $CT_1$ is achieved from junction $J_6$, via line CD, diode $D_1$, junction $J_7$ and line 51 onto the clock pin of device $CT_1$. Upon each triggering pulse received in such line of communication, $CT_1$ provides an output determined sequentially by pins $Q_0$, $Q_1$ and $Q_2$ in a circular permutation. These pins are connected to respective G inputs of devices 11, 12, 13 which in turn cause the corresponding S input thereof (by line 1, 2 or 3) to become data on the D pin outputting on line 4, 5 or 6 analog data, as shown in FIG. 3. Node $J_6$ and line CD are connected to the anodes of two diodes $R_2$ which have their cathodes connected to respective ends A and B of the secondary winding S of isolation transformer, of which a mid tap M is connected to ground. Ends A and B are also connected to the respective anodes of two diodes $R_1$ which have a common node $J_5$ connected to their cathode electrodes. Between nodes $J_{5(+)}$ and $J_{6(-)}$ is connected a conventional DC power supply ($L'_1$ at +12 v, $L'_2$ at −12 v) including a low pass filter disposed symmetrically about the mid tap M, with Zener diodes connected between the respective lines $L'_1$, $L'_2$ and ground.

Isolation transformer T is energized from the primary winding P under AC current generated by periodically switching to ground a voltage source $V_P$ belonging to the power supply unit 101. Switching is effected by a device 42 which is connected between winding P and (via parallel resistors $R_7$, $R_8$) ground. Node $J_{13}$ between device 42 and resistors $R_7$, $R_8$ is connected to the base electrode of a transistor $T_2$. The collector of transistor $T_2$ is (via line 46) connected to one counter 48 associated in central unit 200 with the particular channel. The emitter of $T_2$ is connected to ground. Typically, device 42 is a V-MOS power FET solid state device 2N6660. Device 42 operates as a switch periodically opened and closed by the clock signal (PSD) of line 43.

Considering again multiplexer 50 of the measurement unit 100, and the triggering line 51, triggering operates upon a command of the microcomputer interrupting the clock signal on line 43 for a definite and short duration. Such interruption on line 43 of switch 42 causes at the secondary side of transformer T the rectified voltage at node $J_6$ and on line CD to collapse. Not so, however, at node $J_5$ because the time constant of the power supply of lines $L'_1$, $L'_2$ is much longer than the time constant at node $J_7$ on the anode of diode $D_1$. Accordingly, without disturbing the overall power supply of the measurement unit 100, the interruption of the clock signal of line 43 will cause an abrupt transition on line CD which appears across diode $D_1$ on node $J_7$. Such transition of voltage level on line 51 is causing $CT_1$ to transfer its output from a given Q output to the next, thereby to switch ON a corresponding one of devices 11, 12 and 13. All three data outputs 4, 5 and 6, respectively, are connected by line 10 into the non-inverting input of an operational amplifier $OA_1$ serving as a preamplifier. The output 8 of preamplifier $OA_1$ goes to a node $J_1$ leading by line 32 to the input of an integrator INT built around an operational amplifier $OA_2$ having a capacitor $C_1$ mounted in the feedback loop from the output to the input thereof. Integrator INT is associated with a switch $SW_1$ comprising two J-FET devices 7 and 9 used as current switches. A constant current source CCS supplies a current $I_{CC}$ to node $J_1$, whenever switch $SW_1$ is closed. A flip-flop circuit FF, comprised of two CMOS duel D flip-flops 15, 16 completes the voltage-to-frequency converter 60 in accordance with FIG. 1. This is an original application of a well-known technique. See for instance "The Charge-Balancing A/D Converter: An Alternative to Dual-Slope Integration" by R. C. Kime in Electronics/May 24, 1973, pages 97–100. In operation, the computer monitors and controls the voltage-to-frequency converter 60 of each channel in accordance with a central timer providing a precise clock signal sustained by a quartz oscillator. Typically, from a quartz oscillator having a fundamental frequency of 6 megahertz is derived a 250 kilohertz signal PSD controlling from line 43 the switch 42. The operation of the V/F converter 60 of measurement unit 100 is as follows.

Assuming due to an analog input signal $V_i$ that $I_i$ charges capacitor $C_1$ when applied by line 32 at the non-inverting input of operational amplifier $OA_1$, the integrator charges negatively and a negative-going ramp proportional to $V_i$ is building up. The charge-balancing technique consists in supplying from a constant current source CCS, via a switch $SW_1$, a current $I_{CC}$ which will bring the ramp back above a threshold, and in deriving a pulse each time this will occur. The occurrence is at a rate characteristic of the magnitude of $V_i$. The output of amplifier $OA_2$ is connected via Zener diode ZD to node $J_9$. Node $J_9$ is connected via a resistor to −12 volts and by line 14 to the data D input of CMOS device 15 having its own Q output connected to the data D input of the second CMOS device 16.

Referring to FIG. 4, curves are shown illustrating the operative cycle of the flip-flop devices 15 and 16 of FIG. 3. Curve (d) of FIG. 2 is reproduced as the synchronizing signal from line 23 of FIG. 1. Curve (g) shows the $\overline{Q}$-pin state of device 15 when reset, thus as it appears on line 36 of FIG. 3. Curve (h) is the Q-pin state of device 16, when set by device 15. Curve (i) shows the signal applied to the base of transistor $T_1$ by line 36 to turn it ON. Curve (j) shows discharging of capacitor $C_2$ when transistor $T_1$ is ON. Curve (k) is the signal applied to the base of transistor $T_2$ as a result of the surge of current at the primary P of transformer T, when capacitor $C_2$ is being charged following discharging.

Referring to FIG. 3, flip-flop FF (e.g. devices 15, 16) is clocked by the AC current appearing at node $J_3$ associated with end A of secondary winding S. The pulsated current passes through capacitor $C_4$ onto junction $J_8$ which is common to a resistor connected to a $-12$ volts potential and to a line 23 leading to the clock pin of device 15. The $\overline{Q}$ pin of device 15 is connected to the D pin of device 16 and, via junction $J_{10}$, and line 36 to a coupling capacitor $C_3$ on the base electrode of a transistor $T_1$. The emitter of transistor $T_1$ is connected to ground. The base electrode is connected to ground through a resistor $R_6$. On the other hand, the junction $J_4$ associated with the end B of winding S and the cathodes of one rectifier $R_2$ and the anode of the adjoining rectifier $R_1$ is connected to the collector of transistor $T_1$ via a series network including a diode $D_2$ and a resistor $R_5$. A capacitor $C_2$ is mounted in parallel with the transistor $T_1$ and resistor $R_5$. With such an arrangement, when point A is positive, point B is negative and diode $D_2$ is reverse biased. Therefore, whenever at this time transistor $T_1$ is being turned ON by a controlling voltage applied to its base (curve i of FIG. 4) via line 36 and capacitor $C_3$, the transistor $T_1$ is, in fact, isolated from the power supply. It being so, the conducting transistor $T_1$ discharges capacitor $C_2$ (curve J of FIG. 4). Capacitor $C_2$ is initially charged by the power supply from node $J_4$ via diode $D_2$, namely during the other alternance of the clock signal of line 43, e.g. when A is at a negative potential, while B is at a positive potential. Considering now the concurrent cycle of devices 15 and 16, it is seen that node $J_9$ due to the Zener diode ZD at the output of the integrator $OA_2$, is ramping below the threshold of device 15. If line 14 is below the threshold and device 15 is clocked it will be reset (curve g of FIG. 4.). At the following clock pulse, device 16 will be set (curve h of FIG. 4) and device 15 will be set. At the same time, switch 9 is closed, and by node $J_1$, operational amplifier $OA_2$ ramps up. At this time, the set device 15 by its Q pin and node $J_{10}$ applies a zero at pin D of device 16. Therefore, when the next clock pulse appears, device 16 is reset. This causes switch 7 to be opened and switch 9 to be closed, which terminates ramping up of operational amplifier $OA_2$. It is recalled that when transistor $T_1$ is OFF, $C_2$ is allowed to be charged through diode $D_2$. When device 15 goes from the SET state to the RESET state (curve g of FIG. 4), the ensuing pulse on line 36 goes through capacitor $C_3$ onto the base of transistor $T_1$ which is turned ON (curve i of FIG. 4). Therefore, capacitor $C_2$ is discharged (curve j of FIG. 4) with resistor $R_6$ limiting the discharge current. In the next alternance diode $D_2$ is no longer reversed bias and capacitor $C_2$ is charging. This causes a load in the secondary winding S of isolation transformer T. Consequently, an inrush of current occurs in the primary P of the transformer. Such load is detected (curve k of FIG. 4) by the transistor $T_2$, namely while resistors $R_7$ and $R_8$ apply at junction $J_{13}$ and on the base of transistor $T_2$ a voltage which causes it to be turned ON. Line 46 which connects the collector the central unit 200, transmits a pulse which is applied to the counter 48 (curve f of FIG. 2).

It is observed that while device 15 is RESET upon the positive alternance of the clock signal at junction $J_3$ (or point A of the secondary winding S), the pulse detected by the $\overline{Q}$ pin at junction $J_{10}$ is transmitted via line 36. Upon the subsequent alternance this pulse is detected at the primary side as a current inrush by transistor $T_2$. Thus, this occurs when A is negative and B is positive. It appears that the charge-balancing technique of the prior art has been aptly synchronized so as to translate the V/F conversion cycle into a train of pulses perfectly synchronized with the controlling clock signal of line 43. Concurrently, such pulses are counted synchronously as derived on line 46 to counter 48.

Referring to FIG. 5, by testing in the second and third states of multiplexer 50, counts $C_B$ and $C_{REF}$ are derived through the A/D converter, and such counts accumulated in the associate counter 48 are stored in the RAM of the microcomputer 49. FIG. 5 shows the transfer function which, assuming linear transfer, is a line (CL) passing by two points A and B having respective coordinates $(V_B, C_B)$ and $(V_{REF}, C_{REF})$. Because of the offset and the nature of the input, the derived counts $C_X$ on the abscissa axis do not provide a direct reading of the unknown voltage signal $V_X$.

Referring again to FIG. 5, a linear transfer function (DR) to be used for direct reading is shown. With zero count, namely at the origin of the counts, the actual input voltage is the minimum value expected $(V_1)$ from the output of transducer $TD_1$. For the maximum count available with the count $(C_{RES})$ a maximum value $(V_2)$ is to be derived from the transducer. Thus, the line passing by point D of coordinates $(O, V_1)$ and by point E of coordinates $(C_{RES}, V_2)$ is defined by the "Range" R which is $R=V_2-V_1$, and by the "Resolution" which is a count $C_{RES}$. When the output derived from transducer $TD_1$ is zero, the A/D converter sees:

$$(V_2-V_1)/2=V_B.$$

In other words, $V_B$ defines the middle range between $V_1$ and $V_2$ on the ordinate axis, with negative analog inputs being derived below $V_B$ and positive analog inputs above $V_B$. Typically with a 12-bit resolution, the full scale is $2^{12}$ on the counter for 20 millivolts. Since two polarities are accounted for, the capability is twice, e.g. $2^{13}$. Thus, the range R is 40 millivolts for a resolution of twice 4096.

During calibration, when the multiplexer 50 is in the second state (namely, device 12 closed), the operational amplifier $OA_1$ is measuring bias $V_B$ as if the input from transducer $TD_1$ were zero. For such state of multiplexer 50 the derived count is $(C_B)$. At the third state, the reference voltage $(V_{REF})$ is applied at the input and a corresponding count $(C_{REF})$ is derived.

The constants, then, may be calculated by the microprocessor in accordance with the algorithm.

$$C_S = \frac{\text{RESOLUTION}}{\text{RANGE}} \times \frac{V_{REF}}{C_{REF} - C_B} \quad (1)$$

$$C_{OS} = \frac{\text{RESOLUTION}}{\text{RANGE}} \times \frac{V_B C_{REF} - C_B(V_{REF} + V_B)}{C_{REF} - C_B} + \tfrac{1}{2} \text{Resolution} \quad (2)$$

where "Range" is the spread of the input signal in magnitude, where "Resolution" is $C_{RES}$, where $C_S$ is the slope constant, where $C_{OS}$ is the offset constant.

Equations (1) and (2) are derived from a consideration of the two linear functions illustrated by FIG. 4. From transfer characteristic CL defined by the coordinates of points A and B it is found that:

$$V_X = \frac{V_B - V_{REF}}{C_B - C_{REF}} C_X + \frac{V_{REF}C_B - V_B C_{REF}}{C_B - C_{REF}} \quad (3)$$

Similarly, with transfer characteristic DR and the coordinates of points D and E, it follows that:

$$V_X = (\text{Range/Resolution}) \times C_{XC} + V_B - \tfrac{1}{2}\text{Range} \quad (4)$$

where $C_{XC}$ is the corrected count of $C_X$. $C_{XC}$ when derived from equation (4) appears to be:

$$C_{XC} = (\text{RES/Range})V_X - V_B + \tfrac{1}{2}\text{Range} \quad (5)$$

Inserting $V_X$ from equation (3) into equation (5):

$$C_{XC} = \frac{\text{RES}}{\text{RANGE}} \frac{V_B - V_{REF}}{C_B - C_{REF}} \times (C_X - C_B) + \frac{\text{RES}}{2} \quad (6)$$

It appears from equation (6) that the Range is defined by the particular transducer output at the point of measurement that the Resolution is imposed by the system. On the other hand, $(V_B - V_{REF})$ depends on the stable voltage source SVS and resistors $R_A$, $R_B$ and $R_E$. While Range and Resolution are readily known with precision, it remains to ascertain accurately what $(V_B - V_{REF})$ actually are, since this expression is a key parameter for reliability and precision in the operation of the A/D converter, as shown by equation (6). In this regard, resistors $R_A$, $R_B$ and $R_E$ concurrently with source SVS permit an initial knowledge, or estimation of $(V_B - V_{REF}) = ki$. Starting with such initial information, an actual measurement is performed with a full-scale analog input $V_X = V_{FS}$ which should theoretically lead to a count $\tfrac{1}{2} C_{RES} = C_{FS}$. However, measurement provides $\tfrac{1}{2} C_{RES}^1$, not $\tfrac{1}{2} C_{RES}$. This is a deviation from what should be expected on line (DR) of FIG. 3 for $(V_2 - V_B)$ or $(V_B - V_1)$ which in absolute value is $V_{FS}$. This deviation is attributable to physical discrepancies in the estimation of $(V_B - V_{REF})$. In accordance with the present invention $ki = (V_B - V_{REF})$ is adjusted in proportion to $$C_{RES}^1 / C_{RES}$$

thereby deriving:

$$k_i^1 = ki \times (C_{RES}/C_{RES}^1)$$

Thereafter, in equation (6) the algorithm used for computing $C_{XC}$ will have in front a well defined adjusted constant $k = (\text{RES/RANGE}) \times k_i^1$. Therefore, parameters $C_B$, $C_{REF}$, $C_X$ can now be readily derived with the A/D converter in accordance with the three respective states of multiplexer 50, which together concur in providing an accurate determination of $C_{XC}$ from equation (6). Accordingly, after the adjusted constant $k = (\text{RES/RANGE}) \times k_i^1$ has been determined by the aforementioned experiment at full scale, it is stored in the microcomputer. $C_B$, $C_{REF}$ and $C_X$ are derived and the algorithm is used in computing $C_{XC}$ in accordance with equation (6) using the stored adjusted constant k.

More specifically, $C_B$ and $C_{REF}$ are derived from time to time from $V_B$ and $V_{REF}$ at the input and stored with the adjusted constant k for repeated use when deriving $C_X$ and computing the corrected value $C_{XC}$. In other words, $C_B$ and $C_{REF}$ are refreshed from time to time for more reliability and accuracy.

From the preceding it is observed that the present invention is a departure from prior art practice in the following respects.

Analog-to-digital converters generally utilize variable circuit elements such as potentiometers, variable capacitors, etc. for calibrating the measurement result. Calibration is usually performed at "0" and full scale or at plus and minus full scale.

It is disadvantageous to use calibrating elements because they are costly, take space and impose layout restrictions on the printed circuit boards. They also lead to a circuit of limited resolution. Moreover, temperature coefficients cause errors. The circuit elements are vibration sensitive, they have a limited mechanical life, and they can be easily changed by unauthorized personnel.

In contrast, the present invention provides for storing calibration constants which have been calculated at the time of the calibration. These are translated into digital words and stored into a nondestructive memory, namely the (PROM) of the microcomputer. Sufficient locations are provided in the PROM to allow space for storage of additional constants. Identification such as the serial number is included in the field of the digital word.

While analog-to-digital conversions are being performed by circuit 60, converted analog quantities are processed by the microcomputer using the stored calibration constants to obtain the final value.

Several advantages ensue from the proposed method of deriving digital data from a plurality of parallel channels as described: The calibration constants do not change with temperature, voltage, vibration, environment. There are no temperature coefficient errors, hardware implementation is at low cost, and requires little space. Moreover, the stored constants can be combined with other factors to provide scaling, etc. Resolution can be increased or selected by the length of the "word" used to represent digitally the constant. Finally, the stored constants provide valuable record relative to the performance of the system with regard to long term drift, aging, reliability.

I claim:

1. In a multiplexed data acquisition system for deriving digital data with the assist of a digital computer in relation to a plurality of remote analog data measuring points with at least two analog input signals available at each of said measuring points, the combination of:

a like plurality of voltage-to-frequency (V/F) converters and respective multiplexers, each associated locally with a corresponding measuring point;

a central clock associated with said computer for providing a clock signal;

a like plurality of isolation transformers for providing communication and power, each between said computer and a corresponding one of said converters and associated multiplexer;

each of said V/F converters having a conversion cycle synchronized by said clock signal through said transformers;

said computer interrupting said clock signal to select with said multiplexers one of said two input signals at said measuring points to be passed to the associated V/F converter; and said associated V/F converter outputting a train of pulses characterizing said passed one analog input signal, and said train of pulses being passed to said computer through the associated one of said transformers; and counter means associated with said computer for counting said pulses during a predetermined measurement time interval.

2. In a data acquisition system including a central processor for deriving and treating digital data in relation to a plurality of parallel channels, each channel converting into a train of pulses analog data derived from at least one input at one corresponding measuring point, the combination of:

a central timer associated with said central processor for generating a clock signal; and in each of said channels:

(1) a first unit having a DC power source and at least one power switch controlled by said clock signal for deriving AC current from said power source;

(2) a second unit having rectifier means for providing a DC power supply and a voltage-to-frequency (V/F) converter energized by said DC power supply for converting said analog data into said train of pulses;

(3) an isolation transformer between said first and second units for supplying AC current to said rectifier means;

said V/F converter of said second unit having a conversion cycle synchronized by said clock signal through said first unit and said isolation transformer, and the pulses derived in said second unit being received by said central processor through said isolation transformer and said first unit; and counter means associated with said central processor for counting said pulses during a predetermined measurement time interval.

3. The system of claim 2, with each channel being responsive to at least two analog input signals, and having in said second unit a multiplexer controlled to pass a selected one of said two input signal to said V/F converter when said clock signal is interrupted by said central processor; said V/F converter being operative with the selected one of said at least two analog input signals to provide a corresponding train of pulses for said central processor.

4. The system of claim 3, with three analog input signals being supplied in each of said channels to be passed by the multiplexer to the V/F converter successively upon said clock signal being interrupted by said central processor, a train of pulses corresponding to such an input signal being provided for said central processor between two successive clock signal interruptions; a first one of said input signals being analog data derived from a measuring point, a second input signal being a reference voltage chosen for calibration purpose; a third input signal being a zero-voltage signal for detecting an offset voltage.

5. The system of claim 4, with a counter associated with said central processor; corresponding counts being derived by said counter and the respective counts being combined by said central processor after individual derivation from the first unit thereby to provide a calibrated and scaled representation of the first one of said input signal.

* * * * *